US006846370B2

(12) United States Patent
Allen et al.

(10) Patent No.: US 6,846,370 B2
(45) Date of Patent: Jan. 25, 2005

(54) RESISTIVE MATERIALS

(75) Inventors: Craig S. Allen, Shrewsbury, MA (US); John Schemenaur, Marlborough, MA (US); David D. Senk, Mission Viejo, CA (US); Marc Langlois, Atlanta, GA (US); Xiaodong Hu, Atlanta, GA (US); Jan Tzyy-Jiuan Hwang, Alpharetta, GA (US); Jud Ready, Atlanta, GA (US); Trifon Tomov, Duluth, GA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/190,292

(22) Filed: Jul. 3, 2002

(65) Prior Publication Data

US 2003/0121883 A1 Jul. 3, 2003

Related U.S. Application Data

(60) Provisional application No. 60/303,379, filed on Jul. 6, 2001.

(51) Int. Cl.[7] .................................................. C22C 5/00
(52) U.S. Cl. ........................ 148/430; 420/466; 420/467; 420/468; 428/333; 428/434; 428/457; 204/192.22; 427/101

(58) Field of Search ................................. 148/430, 431; 420/466, 467, 468; 428/333, 434, 457; 204/192.22; 427/101

(56) References Cited

U.S. PATENT DOCUMENTS

| 3,629,781 A | | 12/1971 | Helgeland |
| 3,833,410 A | * | 9/1974 | Ang et al. .................. 428/333 |
| 5,037,670 A | | 8/1991 | Kuo et al. |
| 6,210,592 B1 | | 4/2001 | Hunt et al. |
| 6,562,021 B1 | | 5/2003 | Derbin et al. |

FOREIGN PATENT DOCUMENTS

| EP | 0 976 847 A2 | 2/2000 |
| JP | 10189886 | * 7/1998 |

* cited by examiner

*Primary Examiner*—Sikyin Ip
(74) *Attorney, Agent, or Firm*—S. Matthew Cairns

(57) ABSTRACT

Electrically resistive material including platinum and from about 5 and about 70 molar percent or iridium, ruthenium or mixtures thereof, calculated based on platinum as 100%, are disclosed.

12 Claims, No Drawings

RESISTIVE MATERIALS

This application claims the benefit of U.S. Provisional Application No. 60/303,379, filed on July 6, 2001.

BACKGROUND OF THE INVENTION

The present invention is generally directed to the field of electrically resistive materials. In particular, the present invention is directed to electrically resistive materials that can be deposited as thin films and patterned to form discrete resistors that may be embedded in printed circuit boards.

U.S. Pat. No. 6,210,592 describes thin film resistive material that may be patterned to form discrete resistive elements (resistors) that may be embedded in printed circuit boards. The thin films are formed predominantly of platinum. To increase the resistance, various levels, typically from 0.1 to 20 wt %, particularly from 0.5 to 5 wt %, of total material is a metal oxide and/or a metalloid oxide. The most thoroughly discussed oxide in this application is silica, although others, such as alumina and ceria, are also noted. The thin films described in this application are preferably formed by combustion chemical vapor deposition ("CCVD") as described in U.S. Pat. No. 6,562,021 or controlled atmosphere chemical vapor deposition ("CACVD") as described in European Patent Application EP 976 847 A2.

It may be appreciated that devices that utilize printed circuit boards ("PCBs") as components may be exposed to temperature extremes, and many industry specifications require performance over a temperature range of from −50° C. to 150° C. Over such temperature ranges the electrical performance of the printed circuit board must remain relatively constant for the device to function properly. A problem that has been noted with platinum based thin film resistors, such as those described in above-described U.S. Pat. No. 6,210,592, is that the thermal coefficient of resistivity ("TCR") tends to be greater than is required for many PCB applications. For consistent electrical performance over broad temperature range, it is desired that the TCR of a material be as low as possible.

Accordingly, it is a general object of the present invention to provide electrically resistive materials with low TCRs, particularly such a materials that may be deposited as a thin film, patterned to form discrete resistors, and embedded in printed circuit boards.

SUMMARY OF THE INVENTION

In one aspect, the present invention provides an electrically resistive material comprising platinum and from about 5 to about 70 molar percent of iridium, ruthenium or mixtures thereof, calculated based on platinum as 100%.

In another aspect, the present invention provides an electrically resistive material comprising platinum and from about 5 to about 70 molar percent of iridium, ruthenium or mixtures thereof, calculated based on platinum as 100%, wherein the electrically resistive material is a thin film.

In still another aspect, the present invention provides a printed wiring board including an electrically resistive material comprising platinum and from about 5 to about 70 molar percent of iridium, ruthenium or mixtures thereof, calculated based on platinum as 100%, wherein the electrically resistive material is coated with a dielectric material.

In yet another aspect, the present invention includes an electronic device including a printed wiring board including an electrically resistive material comprising platinum and from about 5 to about 70 molar percent of iridium, ruthenium or mixtures thereof, calculated based on platinum as 100%, wherein the electrically resistive material is coated with a dielectric material.

DETAILED DESCRIPTION OF THE INVENTION

As used throughout the specification, the following abbreviations shall have the following meanings: ° C.=degrees Centigrade; ppm=parts per million, by weight; Hz=herz; psi=pounds per square inch; nm=nanometer; cm=centimeter; wt %=percent by weight; ml=milliliter; min=minute; g=gram; µg=microgram; and PCB=printed circuit board.

Unless otherwise noted, all amounts are percent by weight and all ratios are by weight. All numerical ranges are inclusive and combinable in any order, except where it is obvious that such numerical ranges are constrained to add up to 100%.

The present invention provides an electrically resistive material comprising platinum and from about 5 to about 70 molar percent of iridium, ruthenium or mixtures thereof, calculated based on platinum as 100%. Preferably, such resistive materials are thin film resistors. By "thin film" it is meant that the films are less than or equal to 500 nm. Thus, the present invention further provides an electrically resistive material comprising platinum and from about 5 to about 70 molar percent of iridium, ruthenium or mixtures thereof, calculated based on platinum as 100%, wherein the electrically resistive material is a thin film.

Electrically resistive materials in accordance with the present invention are platinum-based, i.e., the major material is platinum. The resistive materials contain from about 10 to 70 mole percent iridium, ruthenium or mixtures thereof, and preferably 2 mole percent to 50 mole percent, calculated relative to platinum being 100 percent. If ruthenium is used alone (without iridium), it is preferably used at between about 2 and about 10 mole percent calculated relative to platinum being 100 percent. If iridium is used alone (without ruthenium), it is preferably used at between about 20 and about 70 mole percent calculated relative to platinum being 100 percent. In the resistive materials in accordance with the invention, the iridium, ruthenium or mixtures thereof exist in both elemental form and in oxide form. Typically, the iridium, ruthenium or mixtures thereof are from about 50 to about 90 mole percent elemental metal and from about 10 to about 50 mole percent oxide(s) of the iridium, ruthenium or mixtures thereof.

Typically, at a resistance of 100 ohms per square at 25° C., the absolute value of the TCR of the materials in accordance with the invention is about 500 ppm/° C. or less, preferably about 350 ppm/° C. or less, more preferably about 350 ppm/° C. or less, and even more preferably about 100 ppm/° C. or less.

The resistive materials of the present invention are typically deposited on a substrate by a variety of methods. Suitable methods include, but are not limited to, CCVD or CACVD, and preferably by CCVD.

In depositing the resistive materials of the present invention, a precursor solution is typically prepared containing the precursors for both the platinum and the precursor(s) for the iridium, ruthenium or mixtures thereof. Suitable precursors for platinum include, but are not limited to, platinum acetylacetonate ("PtAcAc") and diphenyl-(1,5-cyclooctadiene) platinum (II) ("PtCOD"). Suitable precursors for iridium and ruthenium include, but are not limited to, tris (norbornadiene) iridium (III) acetyl acetonate ("IrNBD"), and bis (ethylcyclopentadienyl) ruthenium (II). The precursors are co-dissolved in a single solvent system, such as toluene or toluene/propane to a concentration (total of platinum, iridium, and/or ruthenium precursors) of from about 0.15 wt % to about 1.5 wt %. This solution is then typically passed through an atomizer to disperse the precursor solution into a fine aerosol and the aerosol is ignited in the presence of an oxidizer, particularly oxygen, to produce the platinum and iridium, ruthenium or mixture thereof zero valence metals(s) and oxide(s).

The zero valence metal(s) and oxide(s) are deposited on a substrate, such as, but not limited to, a conductive metal such as copper or nickel, or a polymer, such as polyimide or polyamideimide, to a desired thickness. Preferably, the present resistive materials include from about 50 to about 90 molar percent of iridium, ruthenium or mixtures thereof in metallic form and from about 20 to about 10 molar percent of iridium, ruthenium or mixtures thereof in oxide form.

Suitable thin film thicknesses include, but are not limited to, from 5 to 500 nm, more typically from about 5 to about 100 nm, most typically from about 5 to 20 nm.

The thin film resistive material on the substrate is then patterned, e.g., with an ablative etching process, such as described in above-mentioned U.S. Pat. No. 6,210,592, to form a pattern of discrete resistors. After the thin film is patterned to form resistors, the TCR may in many cases be further lowered by aging for several hours at slightly elevated temperatures, e.g., 80° C. The resistor pattern may then be embedded in a printed circuit board and integrated into the circuitry in a conventional manner.

The present resistive materials have low TCRs. That low TCRs are achieved by combinations of iridium, ruthenium or mixtures thereof with platinum is surprising in view of the fact that all three metals have high, positive TCRs. Platinum, iridium and ruthenium have thermal coefficients of resistivity (ppm/° C.), measured relative to 100 ohms/square at 25° C., of 3900, 3920, and 4580, respectively. However, the co-deposited elements produce material of the present invention having TCRs of 500 ppm/° C. or less, preferably 350 ppm/° C. or less, more preferably 200 ppm/° C. or less, and still more preferably of 100 ppm/° C. or less (absolute value measured relative to 100 ohms/square at 25° C.).

The invention will now be described in greater detail with reference to specific examples.

EXAMPLE 1

A precursor solution was prepared containing, 23.06 g Pt COD, 17.00 g IrNBD, 7,070 g toluene, 3,404 g propane, and 7.2 g dodecylamine. A continuous feed coater is described in related U.S. patent application Ser. No. 60/233,022 filed 15 Sep. 2000 and 60/249,979, filed 20 Nov. 2000. In this continuous feed coater, two webs of foil, e.g., copper foil, are continuously fed in a generally upward direction, including through an intermediate location where the foils pass closely adjacent each other to define a narrow constriction. Below the constriction is disposed a flame that burns a precursor solution by which is produced the chemicals that deposit on the foil webs to comprise the electrically resistive material.

Using the continuous feed coater, two continuously fed copper foils were coated with a platinum/iridium oxide by combusting the precursor solution and subjecting the copper foil to the flame-produced vapor that was re-directed by a flow of air under the following conditions:

| Torch Setup | | |
|---|---|---|
| Redirect air, standard liter per minute ("slpm") | 90 | |
| Redirect pressure (psi) | 13.6 | |
| Tip oxygen (flame) flowrate (slpm) | 5.5 (left) | 5.3 (right) |
| Tip oxygen (flame) pressure (psi) | 3.8 (left) | 3.7 (right) |
| Solution flow rate (ml/min) | 5.2 (left) | 5.0 (right) |
| CHN heater Set Point (° C.) | 200 (left) | 200 (right) |
| Continuous Feed Coater Setup (temperatures in ° C.) | | |
| Plenum heater | 80/91 (left) | 80/91 (right) |
| Radient Heater | 120/123 (left) | 120/121 (right) |
| Roll Heater temp. | 100/99 (lower) | 100/100 (upper) |
| Roll Heater pressure (psi) | 20 (lower) | 20 (upper) |
| Exhaust Frequency (Hz) | 9.5 | |
| Foil Speed (cm/min) | 1.5 | 1.5 |
| Brake Setting (%) | 22 | 22 |
| Vacuum (in. $H_2O$) | 7.0 | |
| Plenum geometry | 1 cm (top and bottom) | |

A platinum/iridium layer was deposited containing 49 mole % iridium to platinum-iridium loading of 20 $\mu g/cm^2$, the equivalent thickness being 10 nm (assuming 100% theoretical density-actual thickness at least 4–5 times greater). The resistivity was measured at 300 ohms/square at 25° C. The TCR was measured at 360 ppm/° C.

EXAMPLE 2

Under similar conditions to Example 1, the iridium precursor was replaced with a ruthenium precursor, a platinum/ruthenium layer was deposited containing 5.3 mole % ruthenium Pt-Ru loading of 10.6 $\mu g/cm^2$, the equivalent thickness being 5 nm (assuming 100% theoretical density-actual thickness at least 4–5 times greater). The resistivity was measured at 662 ohms/square at 25° C. The TCR was measured at 303 ppm/° C.

What is claimed is:

1. An electrically resistive material comprising platinum co-deposited with about 5 to about 70 molar percent of iridium, ruthenium or mixtures thereof, calculated based on platinum as 100%, wherein from about 50 to about 90 molar percent of the iridium, ruthenium or mixtures thereof is in elemental metal form and about 10 to about 50 mole percent is in oxide form, wherein the electrically resistive material has a thermal coefficient of resistivity of 500 ppm/° C. or less measured at 100 ohms per square at 25°.

2. The electrically resistive material of claim 1 wherein the electrically resistive material is a thin film.

3. The electrically resistive material of claim 1 comprising iridium.

4. The electrically resistive material of claim 1 comprising from about 20 to about 70 mole percent iridium calculated based on platinum as 100%.

5. The electrically resistive material of claim 1 comprising ruthenium.

6. The electrically resistive material of claim 1 comprising from about 20 to about 10 molar percent of said iridium, ruthenium or mixtures thereof in oxide form.

7. The electrically resistive material of claim 1 having a thickness of from 5 to about 500 nm.

8. The electrically resistive material of claim 1 having a thickness of from about 5 to about 100 nm.

9. The electrically resistive material of claim 1 having a thickness of from about 5 to about 20 nm.

10. The electrically resistive material of claim 1 having a thermal coefficient of resistivity of 350 ppm/° C. or less measured at 100 ohms per square at 25° C.

11. The electrically resistive material of claim 1 having a thermal coefficient of resistivity of 200 ppm/° C. or less measured at 100 ohms per square at 25° C.

12. The electrically resistive material of claim 1 having a thermal coefficient of resistivity of 100 ppm/° C. or less measured at 100 ohms per square at 25° C.

* * * * *